US005610078A

United States Patent [19]

Estrera et al.

[11] Patent Number: 5,610,078

[45] Date of Patent: Mar. 11, 1997

[54] METHOD FOR MAKING TRANSMISSION MODE 1.06μM PHOTOCATHODE FOR NIGHT VISION

[75] Inventors: Joseph P. Estrera, Dallas; Keith T. Passmore, Rowlett, both of Tex.

[73] Assignee: Litton Systems, Inc., Woodland Hills, Calif.

[21] Appl. No.: 594,944

[22] Filed: Jan. 31, 1996

Related U.S. Application Data

[62] Division of Ser. No. 282,810, Jul. 29, 1994, Pat. No. 5,506,402.

[51] Int. Cl.[6] .......... H01L 31/18

[52] U.S. Cl. .......... 437/5; 250/214 VT; 437/133

[58] Field of Search .......... 437/5, 126, 133; 250/214 VT; 313/103 CM, 105 CM, 524, 530, 373

[56] References Cited

U.S. PATENT DOCUMENTS

| | | | |
|---|---|---|---|
| 3,894,258 | 7/1975 | Butterwick | 313/102 |
| 3,906,277 | 9/1975 | Schade | 313/365 |
| 3,914,136 | 10/1975 | Kressel | 148/171 |
| 3,951,698 | 4/1976 | Wilson et al. | 148/33.4 |
| 3,960,620 | 6/1976 | Ettenberg | 148/175 |
| 4,096,511 | 6/1978 | Gurnell et al. | 357/30 |
| 4,115,223 | 9/1978 | Thrush | 204/129.6 |
| 4,563,614 | 1/1986 | Howorth | 313/524 |
| 4,644,221 | 2/1987 | Gutierrez et al. | 313/373 |
| 4,980,312 | 12/1990 | Harris et al. | 437/90 |
| 5,268,570 | 12/1993 | Kim | 250/214 |

OTHER PUBLICATIONS

Stringfellow, G. B., "Lattice Parameters and Crystal Structure of Indium–Gallium–Arsenide," *Properties of Lattice–Matched and Strained Indium–Gallium–Arsenide*, P. Bhattacharya, Edit, Institution of Electrical Engineers, London, United Kingdom, 1993.

Takahashi, N. S., "Lattice Parameters, Molecular and Crystal Densities of Aluminum–Gallium–Arsenide," *Properties of Aluminum–Gallium–Arsenide*, S. Adachi, Editor, Institution of Electrical Engineers, London, United Kingdom, 1992.

D. G. Fisher, R. E. Enstrom, J. S. Escher, H. F. Gossenberger and J. R. Appert, *Photoemission Characteristics of Transmission–Mode Negative Electron Affinity GaAs and (In, Ga)As Vapor–Grown Structures*, IEEE Transactions on Electron Devices, vol. ED–21, No. 10 pp. 641–649 (1974).

R. E. Nahory, M. A. Pollack and J. C. DeWinter, *Growth and Characterization of Liquid–Phase Epitaxial in GaAs*, Journal of Applied Physics, vol. 46, No. 2 pp. 775–782 (1975).

A. H. Sommer, *The Element of Luck in Research–Photocathodes 1930 to 1980*, J. Vac. Sci, Technol. A 1 (2), pp. 119–124, Apr.–Jun. 1983.

G. Vergara, L. J. Gomez, J. Capmany and M. T. Montojo, *Adsorption Kinetics of Cesium and Oxygen on GaAs(100)*, Surface Science 278 pp. 131–145 (1992).

(List continued on next page.)

*Primary Examiner*—Edward P. Westin
*Assistant Examiner*—Stephen Calogero
*Attorney, Agent, or Firm*—Baker & Botts, L.L.P.

[57] ABSTRACT

An improved photocathode (12) and image intensifier tube (10) are disclosed along with a method for making both the tube (10) and photocathode (12). The disclosed image intensifier tube (10) creates a visible light image (20) from an image emitting photons (22). The tube (10) comprises a photocathode (12) having an indium-gallium-arsenide active layer (26) and an aluminum-gallium-arsenide window layer (28). The photocathode (12) is operable to emit electrons (23) in response to the photons (22). A display apparatus is coupled to the photocathode (12) and is operable to transform the emitted electrons (23) into a visible light image (24). An embodiment of the invention is capable of detecting 1.06 μm radiation.

17 Claims, 2 Drawing Sheets

OTHER PUBLICATIONS

D. G. Fisher, R. E. Enstrom, J. S. Escher and B. F. Williams, *Photoelectron Surface Escape Probabiltiy of (Ga, in) As: Cs–o in the 0.9 to =1.6 μm Range**, J. Appl. Phys. vol. 43, No. 9, pp. 3815–3823 (1972).

R. L. Bell, L. W. James and R. L. Moon, *Transferred Electron Photoemission from InP+*, Appl. Phys. Letters, vol. 25, No. 11, pp. 645–646 (1974).

J. S. Escher and R. Sankaran, *Transferred Electron Photoemission to 1.4 μm*, Appl. Phys. Lett. 29, 87 (1976).

J. S. Escher, P. E. Gregory, S. B. Hyder and R. Sankaran, *Transferred–Electron Photoemission to 1.65 μm from InGaAs*[a], J. Appl. Phys. 49(4), pp. 2591–2592 (1978).

P. E. Gregory, J. S. Escher, S. B. Hyder, Y. M. Houng and G. A. Antypas, *Field–Assisted Minority Carrier Electron Transport Across a p–InGaAs/ p–InP Heterojunction*[a], J. Vac. Sci, Technol. 15(4), pp. 1483–1487 (1978).

J. S. Escher, R. L. Bell, P. E. Gregory, S. Y. Hyder, T. J. Maloney and G. A. Antypas, *Field–Assisted Semiconductor Photoemitters for the 1–2 μm Range*, IEEE Transactions on Electron Devices ED–27, No. 7, pp. 1244–1250 (1980).

J. S. Escher, P. E. Gregory, S. B. Hyder, R. R. Saxena and R. L. Bell, *Photoelectric Imaging in the 0.9–1.6 Micron Range**, IEEE Electron Device Letters, vol. EDL–2, No. 5, pp. 123–125 (1981).

K. Costello, G. Davis, R. Weiss, and V. Aebi, SPIE Proceedings, *Electron Image Tubes and Image Intensifiers II*, vol. 1449 (1991).

I. P. Csorba, *Recent Advancements in the Field of Image Intensification: the Generation 3 Wafer Tube*, Applied Optics, vol. 18 (14), pp. 2440–2444 (Jul. 1979).

I. P. Csorba, *Current Status of Image Intensification*, Miltronics, pp. 2–11 (Mar./May 1981).

I. P. Csorba, *Current Status and Performance Characteristics of Night Vision Aids*, Opto–Electronic Imaging, Chapter 3, pp. 34–63 (1985).

K. A. Costello, V. W. Aebi and H. F. MacMillan, *Imaging GaAs Vacuum Photodiode with 40*

Quantum Efficiency at 530 nm, SPIE vol. 1243 Electron Image Tubes and Image Intensifiers pp. 99–104 (1990).

A. A. Narayanan, D. G. Fisher, L. P. Erickson and G. D. O'Clock, *Negative Electron Affinity Gallium Arsenide Photocathode Grown by Molecular Beam Epataxy*, J. Appl. Phys. vol. 56(6) pp. 1886–1887 15 Sep. 1984.

METHOD FOR MAKING TRANSMISSION MODE 1.06μM PHOTOCATHODE FOR NIGHT VISION

CROSS REFERENCE TO RELATED APPLICATIONS

This application is a divisional application of U.S. application Ser. No. 08/282,810, filed Jul. 29, 1994 and entitled "TRANSMISSION MODE 1.06NM PHOTOCATHODE FOR NIGHT VISION AND METHOD," now U.S. Pat. No. 5,506,402, issued Apr. 9, 1996.

TECHNICAL FIELD OF THE INVENTION

This invention relates generally to night vision systems, and more particularly, to an improved photocathode and image intensifier tube and a method for making the same.

BACKGROUND OF THE INVENTION

Previously developed night vision systems and/or image intensifiers intensify available ambient light, such as moon light or star light, to produce an output image visible to the human eye. The image intensification process converts low level light into an electron pattern which is projected, for example, onto a phosphorous screen for conversion of the electron pattern into an image visible by an observer. Light beyond 940 nM (near-infrared) is either not detected or detected with very low sensitivity by most existing image intensification systems.

Night vision systems using Gen II (S-20, S-25) and Gen III (GaAs NEA) based photocathodes have little or no photosensitivity beyond wavelengths of 940 nM. Night sky radiation begins to increase dramatically beyond 950 nM wavelengths and existing detectors normally cannot observe this increased night sky irradiance. In addition, most existing night vision systems cannot detect or utilize the active imaging capability of near-infrared based lasers such as the Nd:YAG laser with 1.06 micrometer monochromatic radiation. Because such lasers are being used in an increasing number of modern electronic devices, especially military weapons systems, a need has arisen for image intensifiers and night vision systems capable of detecting 1.06 micrometer monochromatic radiation.

Existing image intensifiers capable of intensifying near-infrared radiation are normally reflection mode devices, field assisted devices, or a combination of the two. A reflection mode photocathode is a semiconductor photocathode where electrons are emitted from its surface due to light striking this same surface. Reflection mode photocathodes are impractical for many applications due to their size. A transmission mode photocathode is normally more compact and easier to use than a reflection mode photocathode. In a transmission mode photocathode, light strikes one surface of the photocathode and electrons are emitted from the opposite side. Typically, reflection mode devices have an active layer 5–10 microns thick while transmission mode devices have an active layer 1–2 microns thick.

Existing field assisted (or transferred electron) devices have a photocathode surface that is reverse biased. Field assisted devices often suffer from gross imaging problems due to enhanced emission and dark currents from reverse surface biasing. In addition, such devices are more costly to implement into a system as additional electronic circuitry is required.

Previously developed transmission mode, non-field assisted photocathodes capable of detecting near-infrared radiation suffer from at least three major disadvantages. First, these photocathodes have a window layer formed from aluminum-indium-arsenide. An aluminum-indium-arsenide window is difficult to form using a metal organic chemical vapor deposition (MOCVD) process. Instead, an aluminum-indium-arsenide layer is normally grown using molecular beam epitaxy (MBE). Molecular beam epitaxy is normally a much slower and more expensive process than MOCVD. Accordingly, photocathodes formed from aluminum-indium-arsenide are expensive to produce. Second, because an MBE process is normally used to form one of the layers of such photocathodes, existing Gen III production equipment cannot be used to produce the photocathodes without substantial modification. Third, aluminum-indium-arsenide window layers have an optical transmission cutoff of approximately 600 nM for the window layer. This optical transmission cutoff wavelength is undesirably high. Because such photocathodes cut off shorter wavelengths of light, the resulting image quality degrades due to a lesser degree of contrast between features of the displayed image.

SUMMARY OF THE INVENTION

In accordance with the present invention, an improved image intensifier tube and improved photocathode, and a method for making the photocathode and tube are disclosed. The disclosed image intensifier tube creates a visible light image from image emitting photons. The tube comprises a photocathode having an indium-gallium-arsenide active layer and an aluminum-gallium-arsenide window layer. The photocathode is operable to emit electrons in response to the photons. A display apparatus is coupled to the photocathode and is operable to transform the emitted electrons into a visible light image.

One important technical advantage of the present invention is that existing Gen III production equipment can be used to produce the disclosed image intensifier tube and photocathode. The disclosed photocathode and image intensifier tube are also less expensive to produce than existing photocathodes capable of detecting 1.06 μm radiation and other near-infrared radiation. The window layer of the disclosed photocathode and image intensifier tube has a lower wavelength optical transmission cutoff than do existing photocathodes and image intensifier tubes capable of detecting 1.06 μm radiation. The disclosed photocathode is a transmission mode, non-field-assisted device, making it smaller in size and easier to implement into an imaging system. The disclosed image intensifier tube and photocathode are also compatible with the Gen III image intensifier format. The invention can also be used to actively image an Nd:YAG (1.06 μm) laser. Applications of the invention include military applications, medical applications, and other scientific applications, including gated imaging technology, and CCD camera technology. Other technical advantages of the disclosed invention will be apparent to those of ordinary skill in the art.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention and its advantages are best understood by referring to FIGS. 1–5 of the drawings, like numerals being used for like and corresponding parts of the various drawings.

Figure 1:
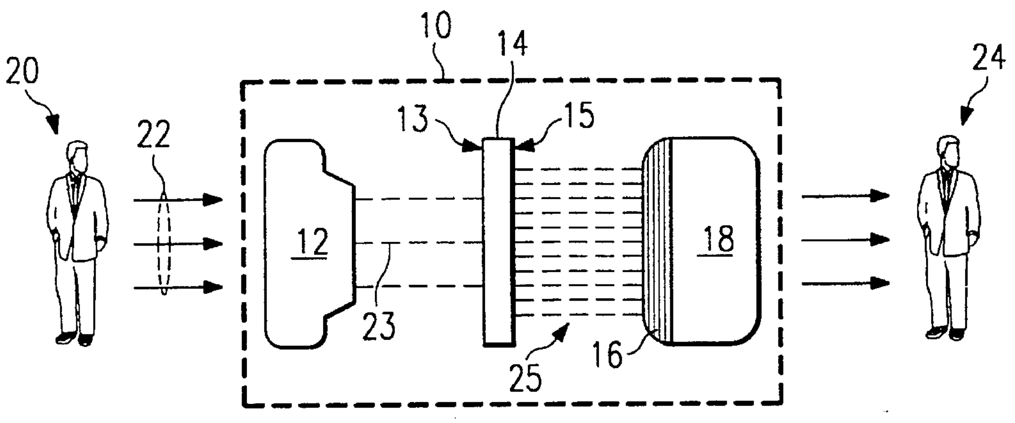
FIG. 1 illustrates an image intensifier tube made in accordance with the teachings of the present invention.

FIG. 1 illustrates an image intensifier tube 10 made in accordance with the teachings of the present invention. Image intensifier tube 10 comprises a unique photocathode 12 constructed in accordance with the teachings of the present invention and operable to emit electrons in response to photons emitted from an image. A display apparatus couples to photocathode 12 and is operable to transform the emitted electrons into a visible light image. In the embodiment illustrated in FIG. 1, the display apparatus comprises a multichannel plate 14 adjacent to photocathode 12, a phosphor screen 16 adjacent to multichannel plate 14 and a fiber optic anode 18 adjacent to phosphor screen 16.

Multichannel plate 14 may comprise, for example, a thin wafer having several parallel hollow glass fibers each oriented slightly off axis with respect to incoming electrons. In the embodiment of FIG. 1, multichannel plate 14 multiplies incoming electrons with a cascade of secondary electrons through the channels by applying a voltage across the two faces, 13, 15 of multichannel plate 14. The surface of phosphor screen 16 receives electrons from multichannel plate 14 and phosphor screen 16 generates a visible light image. Fiber optic anode 18 translates the image produced by phosphorus screen 16 using, for example, fiber optic bundles to form a translated image that is visible to an observer.

FIG. 1 further illustrates the operation of image intensifier tube 10. An image 20 emits photons 22 which are directed onto a surface of photocathode 12. Photocathode 12 transforms photons 22 into electrons 23 which gain energy from an electric field between photocathode 12 and multichannel plate 14. Multichannel plate 14 multiplies the incoming electrons 23 with a cascade of secondary electrons to form multiplied electrons 25 which are then transported by a high electric field between multichannel plate 14 and the surface of phosphor screen 16. As electrons strike phosphor screen 16, they generate a visible light image which is then translated by fiber optic anode 18 into an output image 24 visible to an observer.

Photocathode 12 of the present invention has an indium-gallium-arsenide active layer and an aluminum-gallium-arsenide window layer. One embodiment of photocathode 12 is described below. Although one display apparatus coupled to photocathode 12 has been described, another type of display apparatus could be used without departing from the scope and teachings of the present invention. For example, gated imaging technology or a CCD device could be used.

Figure 2:
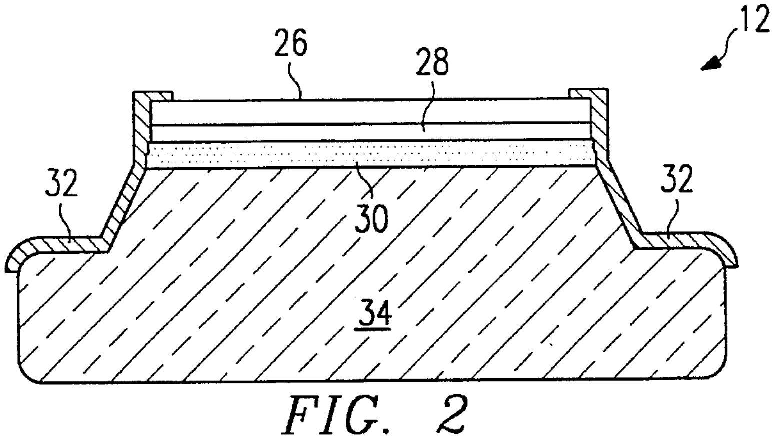
FIG. 2 illustrates a photocathode made in accordance with the teachings of the present invention.

FIG. 2 illustrates an embodiment of photocathode 12 made in accordance with the teachings of the present invention. Photocathode 12 comprises an indium-gallium-arsenide active layer 26, an aluminum-gallium-arsenide window layer 28 grown on active layer 26, a face plate 34 coupled to window layer 28 and an electrode 32 coupled to face plate 34, active layer 26 and window layer 28. Photocathode 12 may also include coating layer 30 applied to window layer 28 to serve as an anti-reflection thermal coating.

In the embodiment illustrated in FIG. 2, face plate 34 is made of glass and is coupled to window layer 28 by thermally bonding face plate 34 to coating layer 30. Face plate 34 could be made of another material without departing from the scope and teachings of the present invention. Face plate 34 is formed from Corning 7056 glass in the disclosed embodiment. 7056 glass or its equivalent is advantageously used because its thermal expansion coefficient matches closely with the thermal expansion coefficient of photocathode 12.

Electrode 32 is formed from chrome-gold in the illustrated embodiment. Electrodes made of other materials can be used without departing from the scope and teachings of the present invention. Electrode 32 may be applied to the circumference of face plate 34, active layer 26, window layer 28, and coating layer 30 using standard thin film techniques. The electrode-provides an electrical contact between photocathode 12 and other components of an image intensifier or night vision system. Chrome-gold was chosen for this embodiment because it aids in vacuum sealing an image intensifier tube.

Active layer 26 is formed with indium-gallium-arsenide. In the embodiment illustrated in FIG. 2, active layer 26 has a thickness of approximately 1½ to 3 microns. The indium composition of active layer 26 is normally between 15 and 25 percent. This composition will normally ensure that photocathode 12 is sensitive to near-infrared radiation, including 1.06 μm radiation. A 15 to 25 percent composition of indium is defined as follows: In the formula, $In_xGa_{1-x}As$, the value x, is between 0.15 and 0.25. This notation will be familiar to those in the photocathode art. Experimental results indicate that an indium composition greater than 15 percent will normally allow detection of 1.06 μm radiation.

Active layer 26 of the disclosed embodiment is doped using a P-type impurity with a level of between $5*10^{18}$ and $9*10^{18}$ atoms per cubic centimeter. In the embodiment illustrated in FIG. 2, Zinc is used as the P-type impurity. Other P-type impurities could be used, such as tellurium, germanium, or selenium. Doping provides electron transportability through active layer 26 and reduces the surface work function of active layer 26 for surface electron escapability.

Window layer 28 is made of aluminum-gallium-arsenide. Window layer 28 serves as a short wavelength cutoff filter for incoming light into photocathode 12. Window layer 28 may also serve as a barrier and reflector for electrons trying to travel from window layer 28 to active layer 26. Window layer 28 may also serve as a supporting and thermal protective layer for active layer 26.

In the embodiment illustrated in FIG. 2, window layer 28 has a thickness of between 0.8 and 1.0 microns. Window layer 28 is also doped with a P-type impurity, such as Zinc, at a level of between $1*10^{18}$ and $3*10^{18}$ atoms per cubic centimeter. As stated above, other P-type impurities may be used. The aluminum composition and thickness of window layer 28 may be adjusted to obtain the desired amount of short wavelength radiation through the window. In the embodiment illustrated in FIG. 2, window layer 28 has an optical transmission cutoff wavelength of approximately 550 nanometers. Using a proper thickness and aluminum composition, the transmission cutoff wavelength of window layer 28 may be reduced to approximately 450 nanometers.

Coating layer 30 comprises an anti-reflective layer formed on the surface of window layer 28 and a thermal protective layer formed on the anti-reflective layer. In the embodiment illustrated in FIG. 2, silicon nitride serves as the anti-reflective layer, while silicon dioxide serves as the thermal protective layer. Other materials can be used for these layers without departing from the scope and teachings of the present invention. Silicon dioxide was chosen in the disclosed embodiment for the thermal protective layer because its index of refraction is approximately equal to that of face plate 34. By using a material for the thermal protective layer with an index of refraction approximately equal to that of face plate 34, the image suffers less distortion. The thermal protective layer also may serve as a protective layer for the anti-reflective layer and serve as a bonding layer for coupling face plate 34 to window layer 28. In the embodiment illustrated in FIG. 2, the anti-reflective layer and the thermal protective layer are each approximately 1,000 angstroms thick.

Figure 3:
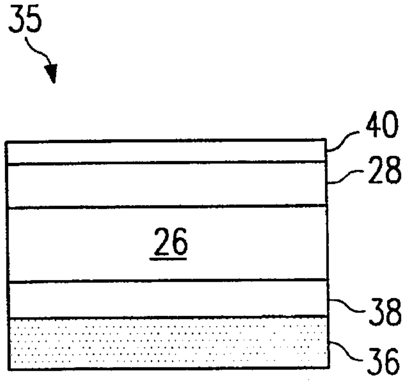
FIG. 3 illustrates a wafer structure used to produce the disclosed photocathode.

The method of making photocathode 12 can best be understood by referring to FIG. 3. FIG. 3 illustrates a multi-layer wafer 35 used in making photo-cathode 12. Wafer 35 comprises substrate 36, stop layer 38, active layer 26, window layer 28, and cap layer 40. The steps used to make photocathode 12 will be described below. The disclosed method of making photocathode 12 utilizes process steps used in standard Gen III processes and fabrication techniques.

Multi-layer wafer 35 is an epitaxially grown wafer structure. Wafer 35 may be formed, for example, using an MOCVD process. The fabrication process for the illustrated embodiment begins by using a commercially available single crystal gallium arsenide substrate 36 with a low defect density to serve as substrate 36. Substrate 36 will be the foundation and support for the epitaxial growth of subsequent layers. Another type of substrate 36 could be used without departing from the scope and teachings of the present invention.

A stop layer 38 is grown on substrate 36. Stop layer 38 in the disclosed embodiment is made of aluminum-gallium-arsenide. In later processing steps, substrate 36 will be etched off; stop layer 38 prevents further etching into subsequent layers. Stop layer 38 may have, for example, a thickness between approximately 1 and 1.5 microns and an aluminum composition of 45 percent or greater. The aluminum composition is chosen to ensure that the selective etch used to remove substrate 36 will stop at stop layer 38. Other materials could be used to form stop layer 38 without departing from the scope and teachings of the present invention.

Active layer 26 is then epitaxially grown on top of stop layer 38. As discussed above, active-layer 26 is indium-gallium-arsenide. The thickness and composition of active layer 26 in the embodiment illustrated in FIG. 3 is discussed above in connection with FIG. 2.

Window layer 28 is epitaxially grown on active layer 26. As discussed above in connection with FIG. 2, window layer 26 is made of aluminum-gallium-arsenide. The function, thickness, and structure of window layer 28 are described above in connection with FIG. 2.

A cap layer 40 is epitaxially grown on top of window layer 28. Cap layer 40, for example, may be formed of gallium arsenide. Cap layer 40 may serve to protect window layer 28 during the cool-down of the full epitaxial structure and/or during wafer transport.

After wafer 35 is grown, cap layer 40 is removed with a proper selective etch to expose window layer 28. Coating layer 30, as illustrated in FIG. 2, is then applied to the exposed surface of window layer 28. Coating layer 30 itself comprises an anti-reflective layer and a thermal bonding layer. The details of these layers are described above in connection with FIG. 2. After coating layer 30 has been applied to the surface of window layer 28, the full wafer structure is heated during a thermal compression bonding of the wafer structure to face plate 34.

After face plate 34 has been coupled to window layer 28, substrate 36 and stop layer 38 are selectively etched to expose active layer 26. Using standard thin film techniques, electrode 32 is formed and coupled to face plate 34, active layer 26, window layer 28, and coating layer 30. In the disclosed embodiment, electrode 32 is applied to the circumference of window layer 28, active layer 26, coating layer 30, and face plate 34, as illustrated in FIG. 2.

Photocathode 12 is then etched to remove residual gas, moisture, and oxides which have attached to the surface of active layer 26 during previous processing. Photocathode 12 is next placed into a vacuum system and heated to clean the surface of active layer 26. To activate active layer 26, cesium and oxygen vapor is evaporated onto the surface of active layer 26. During evaporation, an input light enters the surface of active layer 26 producing an output current measured from electrode 32. Cesium and oxygen vapors are further applied until achieving a maximum electrode current. At this point, the evaporation process stops and photocathode 12 is sealed into an image intensifier tube such as image intensifier tube 10.

Figure 4:
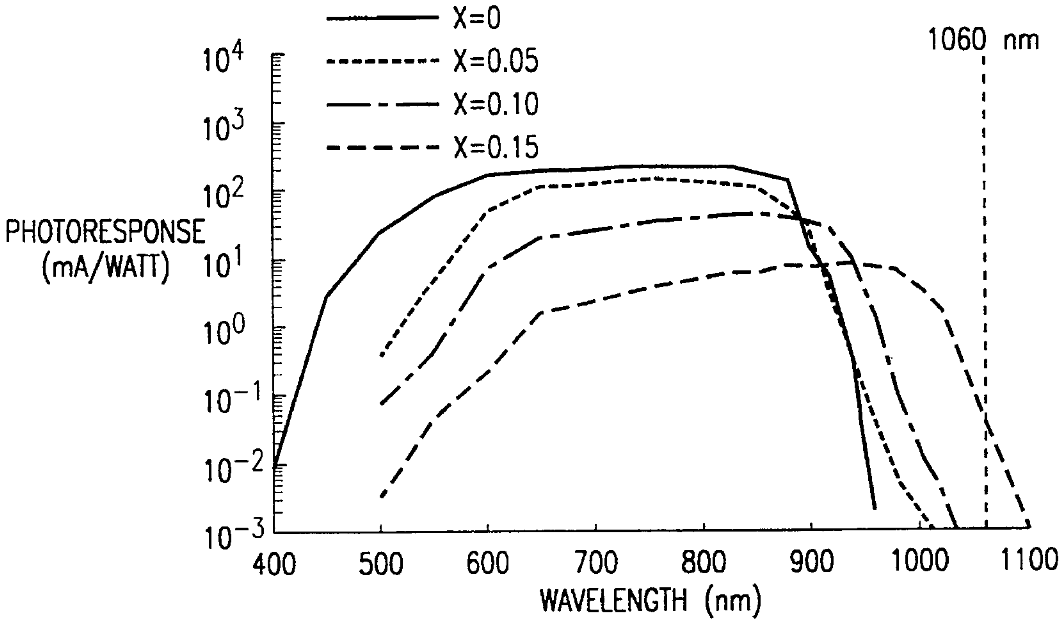
FIG. 4 illustrates the spectral response of various indium-gallium-arsenide photocathodes with a varying indium composition.

As previously discussed, for the illustrated embodiment, active layer 26 has an indium composition greater than 15 percent to allow photocathode 12 to be sensitive to near-infrared radiation, including 1.06 μm radiation. FIG. 4 illustrates the spectral response of photocathodes having indium-gallium-arsenide active layers with various compositions of indium. In FIG. 4, x indicates the indium composition of the active layer as described by the formula $In_xGa_{1-x}As$. As illustrated, an acceptable photo response to 1.06 μm radiation is achieved with an indium composition of 15 percent or greater.

Figure 5:
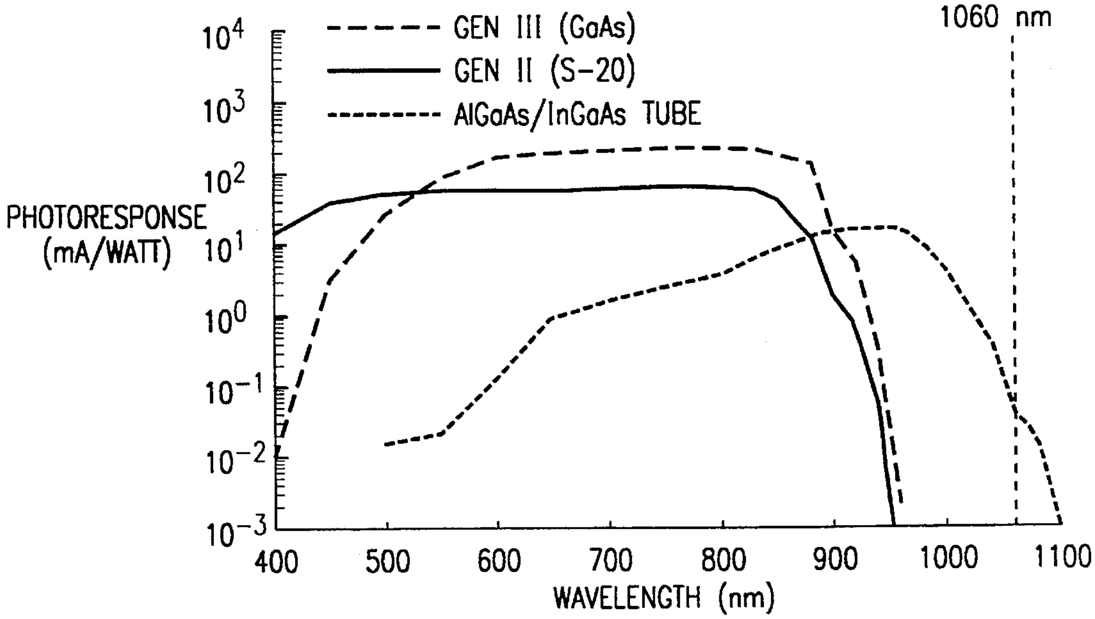
FIG. 5 illustrates a graph comparing the spectral response of conventional Gen II and Gen III image intensifier tubes with the image intensifier tube of the present invention.

The disclosed photocathode has significant advantages over existing photocathodes. As illustrated in FIG. 5, the disclosed photocathode is capable of detecting near-infrared radiation including 1.06 μm radiation, unlike Gen II and Gen III photocathodes. FIG. 5 also illustrates that the disclosed photocathode employs an aluminum-gallium-arsenide window layer with an optical transmission cutoff wavelength below 600 nanometers. The image intensifier tube of the present invention illustrated in FIG. 5 has an optical transmission cutoff wavelength of approximately 500 nanometers. The lower optical transmission cutoff wavelength of the present invention gives additional contrast to features of the detected image and makes the image clearer. The additional blue enhancement achieved by the lower optical transmission cutoff wavelength is especially important for detecting images where a large degree of sand is present such as on a beach or in a desert environment.

The disclosed invention can be manufactured using Gen III production processes and equipment, thus lowering the cost of production. A manufacturer need not convert an existing plant to produce the disclosed photocathodes. The disclosed transmission mode photocathode is compatible with Gen III image intensifier formats and can be easily incorporated into night vision equipment. The disclosed photocathode allows active imaging with an Nd:YAG (1.06 μm) laser. Applications of the invention include military applications especially those involving active imaging with a 1.06 μm laser platform. The invention may also be used with gated imaging technology and/or charge coupled device (CCD) camera technology. Because the disclosed photocathode allows detection of low-level, near-infrared radiation, it is useful in various medical applications and other scientific applications.

Although the present invention and its advantages have been described in detail, it should be understood that various changes, substitutions and alterations can be made therein without departing from the spirit and scope of the invention as defined by the appended claims.

What is claimed is:

1. A method of making a photocathode, comprising:

forming a wafer structure according to the steps of growing an indium-gallium-arsenide active layer wherein the composition of indium, x, as defined by the formula $In_xGa_{1-x}As$, in said active layer is between 0.15 and 0.25, growing an aluminum-gallium-arsenide window layer on said active layer, bonding a face plate to said wafer structure;

forming an electrode coupled to said face plate, said active layer, and said window layer.

2. The method of claim 1 wherein said step of forming a wafer further includes the steps of:

forming a stop layer on a substrate wherein said active layer is grown on said stop layer;

growing a cap layer on said window layer, etching said cap layer to expose said window layer, and applying a coating layer to an exposed surface of said window layer.

3. The method of claim 2, further comprising the step of:

etching said substrate and said stop layer to expose a surface of said active layer.

4. The method of claim 2 wherein said applying step further comprises the steps of:

forming an anti-reflective layer of silicon nitride on said window layer;

forming a thermal protective layer of silicon dioxide on said anti-reflective layer; and wherein said bonding step comprises thermally bonding said thermal protective layer to said face plate.

5. The method of claim 2, further comprising the steps of:

etching said substrate and said stop layer to expose a surface of said active layer;

etching said exposed surface of said active layer to remove impurities from said exposed surface;

activating said active layer by evaporating cesium and oxygen vapor onto said exposed surface of said active layer.

6. The method of claim 5, wherein evaporating occurs until maximum electrode current is achieved through said electrode.

7. The method of claim 5 wherein said step of forming a wafer further includes the steps of:

forming a stop layer on a substrate wherein said active payer is grown on said stop layer;

growing a cap layer on said window layer, etching said cap layer to expose said window layer, and applying a coating layer to an exposed surface of said window layer.

8. The method of claim 7 wherein said applying step further comprises the steps of:

forming an anti-reflective layer of silicon nitride on said window layer;

forming a thermal protective layer of silicon dioxide on said anti-reflective layer; and wherein said bonding step comprises thermally bonding said thermal protective layer to said face plate.

9. A method of making an image intensifier tube for creating a visible light image from an image that is emitting photons, comprising:

forming a photocathode operable to emit electrons in response to said photons according to the steps of growing an indium-gallium-arsenide active layer wherein the composition of-indium, x, as defined by the formula $In_xGa_{1-x}As$, in said active layer is between 0.15 and 0.25, growing an aluminum-gallium-arsenide window layer on said active layer, coupling a display apparatus to said photocathode, said display apparatus operable to transform said emitted electrons into a visible light image.

10. The method of claim 9, wherein said display apparatus comprises:

a multichannel plate adjacent to said photocathode and operable to multiply said electrons to form multiplied electrons;

a phosphor screen operable to receive said multiplied electrons and generate a visible light image therefrom;

a fiber optic anode to translate said visible light image.

11. The method of claim 9, wherein said window layer has an optical transmission cut-off wavelength less than 600 nm.

12. The method of claim 9, wherein said step of forming a photocathode further comprises the steps of:

bonding a face plate to said window layer;

forming an electrode coupled to said face plate, said active layer, and said window layer.

13. The method of claim 9, wherein said step of forming a photocathode further comprises the steps of:

forming a stop layer on a substrate wherein said active layer is grown on said stop layer;

growing a cap layer on said window layer, etching said cap layer to expose said window layer, and applying a coating layer to an exposed surface of said window layer.

14. The method of claim 13, wherein said step of forming a photocathode further comprises the step of:

etching said substrate and said stop layer to expose a surface of said active layer.

15. The method of claim 13, wherein said step of forming a photocathode further comprise the steps of:

bonding a face plate to said window layer;

forming an electrode coupled to said face plate, said active layer, and said window layer;

wherein said applying step further comprises the steps of forming an anti-reflective layer of silicon nitride on said window layer, and forming a thermal protective layer of silicon dioxide on said anti-reflective layer; and wherein said bonding step comprises thermally bonding said thermal protective layer to said face plate.

16. The method of claim 13, wherein said step of forming a photocathode further comprises the steps of:

etching said substrate and said stop layer to expose a surface of said active layer;

etching said exposed surface of said active layer to remove impurities from said exposed surface;

activating said active layer by evaporating cesium and oxygen vapor onto said exposed surface of said active layer.

17. The method of claim 16, wherein said step of forming a photocathode further comprises the steps of:

bonding a face plate to said window layer;

forming an electrode coupled to said face plate, said active layer, and said window layer; and wherein evaporating occurs during said activating step until maximum electrode current is achieved through said electrode.

* * * * *